(12) United States Patent
Ewanchuk et al.

(10) Patent No.: US 9,515,012 B2
(45) Date of Patent: Dec. 6, 2016

(54) PACKAGE OF POWER DIES AND THREE-PHASE POWER CONVERTER

(71) Applicant: MITSUBISHI ELECTRIC CORPORATION, Tokyo (JP)

(72) Inventors: Jeffrey Ewanchuk, Rennes (FR); Stefan Mollov, Rennes (FR); Guillaume Lefevre, Rennes (FR)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 161 days.

(21) Appl. No.: 14/620,762

(22) Filed: Feb. 12, 2015

(65) Prior Publication Data

US 2015/0235930 A1   Aug. 20, 2015

(30) Foreign Application Priority Data

Feb. 17, 2014  (EP) .................................... 14155455

(51) Int. Cl.
| | |
|---|---|
| *H01L 23/495* | (2006.01) |
| *H02M 7/537* | (2006.01) |
| *H01L 23/34* | (2006.01) |
| *H01L 23/538* | (2006.01) |
| *H01L 23/36* | (2006.01) |
| *H01L 21/48* | (2006.01) |

(52) U.S. Cl.
CPC ..... *H01L 23/49568* (2013.01); *H01L 21/4846* (2013.01); *H01L 23/345* (2013.01); *H01L 23/36* (2013.01); *H01L 23/49575* (2013.01); *H01L 23/5385* (2013.01); *H02M 7/537* (2013.01)

(58) Field of Classification Search
CPC .... H01L 23/345; H01L 23/36; H01L 23/5385; H01L 21/4846
See application file for complete search history.

(56) References Cited

U.S. PATENT DOCUMENTS

| | | | | |
|---|---|---|---|---|
| 5,182,632 A | * | 1/1993 | Bechtel | ............... H01L 23/3675 257/713 |
| 7,589,412 B2 | * | 9/2009 | Kashimoto | ........... H01L 21/565 257/693 |
| 8,269,244 B2 | * | 9/2012 | Hussell | ............... H01L 25/0753 257/712 |
| 2009/0160048 A1 | * | 6/2009 | Nakatsu | ............... H01L 23/3675 257/714 |

* cited by examiner

*Primary Examiner* — Alonzo Chambliss
(74) *Attorney, Agent, or Firm* — Birch, Stewart, Kolasch & Birch, LLP

(57) ABSTRACT

The present invention concerns a package of power dies composed of a first part and a second part, the first part including a plaque having cavities on which dies are placed, the plaque is placed on a first, a second, and a third metallic plates placed on an electric insulation substrate placed on a fourth metallic plate, the second part including a fifth and a sixth metallic plates placed on another electric insulation substrate placed on a seventh metallic plate, the dies are divided into a first group of dies and a second group of dies and wherein the first and second plate are a positive and negative DC voltage connections, the third plate is a gate connection of the second group of dies, the fourth plate is an AC voltage connection and the fifth plate is a gate connection of the first group of dies.

6 Claims, 7 Drawing Sheets

PACKAGE OF POWER DIES AND THREE-PHASE POWER CONVERTER

The present invention relates generally to a packaging of a power module composed of plural power dies.

Power modules need to evacuate the heat generated by power dies. The heat generally travels in the direction of lowest thermal impedance, and for a typical power module, it may include six thermal interface layers. Due to the large amount of heat generated, a heat-sink is typically required to minimize the thermal stress on the power module, adding more thermal interfaces. Therefore, a significant amount of thermal impedance is present in classical power modules, leading research to drive methodologies for reducing the number of thermal layers.

In order to electrically connect the power die with the external world, metal bond wires are currently the most dominate interconnection technique used for power electronic modules. Unfortunately, these bond wires are major contributor to parasitic elements within a power module but are commonly used due to their relative industry maturity, low construction costs and high configurability.

The present invention aims at providing a package of power dies which is simple to realize from typical power module components and metal bending, while also providing good thermal transfer performance.

To that end, the present invention concerns a package of power dies characterized in that the package of power dies is composed of a first part and a second part, the first part being composed of a plaque composed of cavities on which dies are placed, the plaque is placed on a first, a second, and a third metallic plates placed on an electric insulation substrate, the electric insulation layer is placed on a fourth metallic plate, the second part being composed of a fifth and a sixth metallic plates placed on another electric insulation substrate, the other electric insulation layer being placed on a seventh metallic plate, the fourth and the seventh metallic plates are mechanically joined, the dies are divided into two groups of dies, a first group of dies having an electric contact with the first, fifth and sixth metallic plates and a second group of dies being in contact with the second, third and sixth metallic plates and wherein the first plate is a positive DC voltage connection, the second plate is a negative DC voltage connection, the third plate is a gate connection of the dies of the second group of dies, the fourth plate is an AC voltage connection and the fifth plate is a gate connection of the gates of the first group of dies.

Thus, the package of power dies provides double sided cooling. Furthermore, the reduction in construction complexity is accomplished by incorporating the copper layers of the substrate for much of the module's construction. Thus, by utilizing these copper planes, the module features direct substrate cooling and double sided cooling, while primarily reducing in parasitic inductances as necessary for the application of emerging power devices.

According to a particular feature, the first, second and fifth metallic plates extend outside the fourth and the seventh metallic plates mechanically joined and are folded outside the fourth and the seventh metallic plates mechanically joined.

Thus, instead of having several connection interfaces, the present invention reduces complexity and parasitic components.

According to a particular feature, the folded parts lie on an interconnection component placed on a mechanical support.

Thus, the present invention reduces construction complexity.

According to a particular feature, the mechanical support is a cover of a reservoir comprising heat transfer medium and the fourth and the seventh metallic plates mechanically joined are immerged in the heat transfer medium.

Thus, the present invention provides an efficient thermal transfer.

According to a particular feature, the first, second, third, fifth and sixth metallic plates extend outside the fourth and the seventh metallic plates mechanically joined and are connected to gate drivers of the dies.

Thus, the present invention reduces complexity and parasitic components.

The present invention concerns also a three-phase power converter comprising three packages of power dies.

Thus, the present invention is well suited for three phase applications. Only one converter is needed.

The characteristics of the invention will emerge more clearly from a reading of the following description of an example embodiment, the said description being produced with reference to the accompanying drawings, among which:

Figure 1:
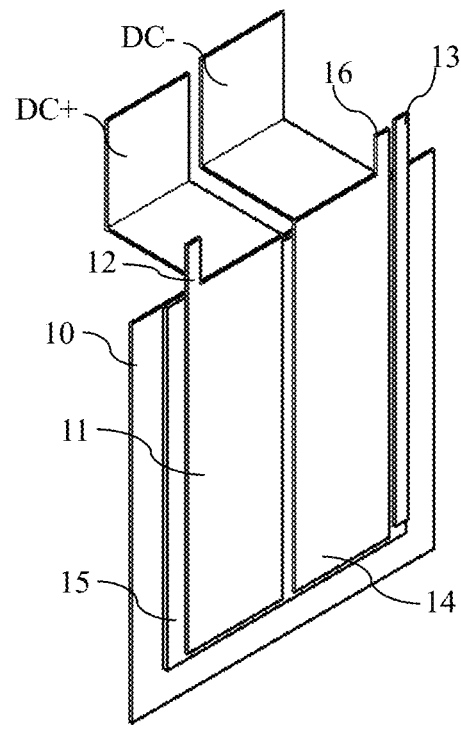
FIG. 1 represents a first part of a package of power dies.

The first part of a package of power dies is composed of a metallic plate 10 on which an electric insulating and thermally conductive substrate 15 is placed. A first metallic plate 11 and a second metallic plate 14 are put on an electric insulation layer, for example a ceramic layer. The metallic plates are for example copper plates and can be joined together with the insulation substrate 15 to form a 'direct copper bonded' substrate.

The metallic plate 11 comprises a first connection part 12 and a second connection part DC+ which is folded.

The second connection part DC+ is used for connecting the package of power dies to a positive DC voltage terminal and the first connection part 12 is used for providing a connection to drivers not shown in FIG. 1 to the positive electric voltage terminal.

The metallic plate 14 comprises a first connection part 16 and a second connection part DC− which is folded.

The second connection part DC− is used for connecting the package of power dies to a negative DC voltage terminal and the first connection part 16 is used for providing a connection to drivers not shown in FIG. 1 to the negative electric voltage terminal.

A third metallic plate 13 is placed on the electric insulation plate 15. The third metallic plate 13 purpose is to provide an electric connection of gates of dies to drivers. The metallic plate 13 is formed to provide contact with the individual gates of dies, but is not shown on FIG. 1 for simplicity.

Figure 2:
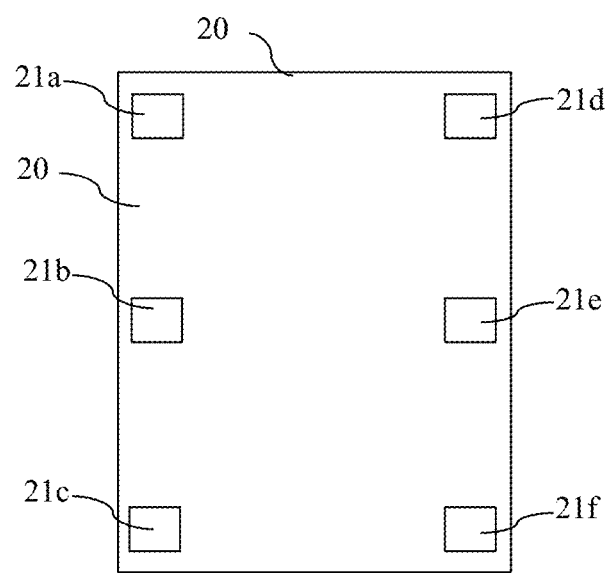
FIG. 2 represents a plaque used for placing dies on the first part of the package of power dies.

FIG. 2 represents a plaque used for placing dies on the first part of the package of power dies.

The plaque 20 used for placing dies on the first part of the package of power dies comprises plural holes which have the shape of dies.

For example, the plaque 20 comprises six holes noted 21a to 21f.

The plaque 20 is for example a ceramic plaque.

Figure 3:
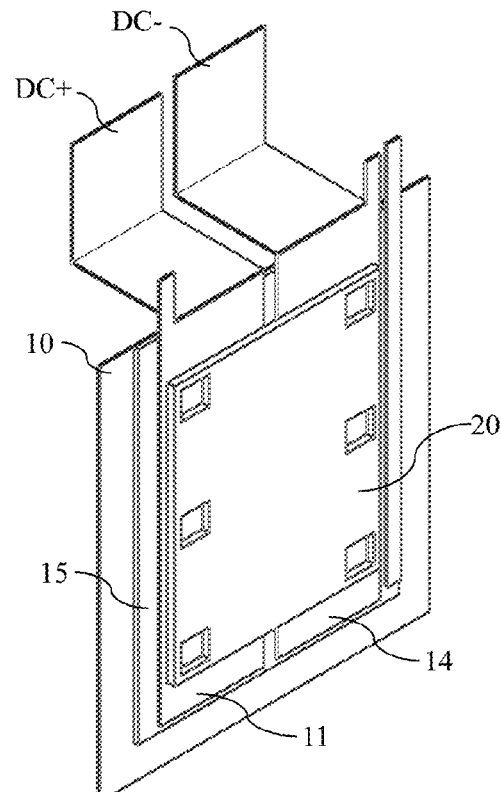
FIG. 3 represents an assembly of the plaque used for placing dies and the first part of the package of power dies.

FIG. 3 represents an assembly of the plaque used for placing dies and the first part of the package of power dies.

The holes 21a to 21c of the plaque 20 enable an electric contact to the metallic plate 11 and the holes 21d to 21f of the plaque 20 enable an electric contact to the metallic plate 14.

Figure 4:
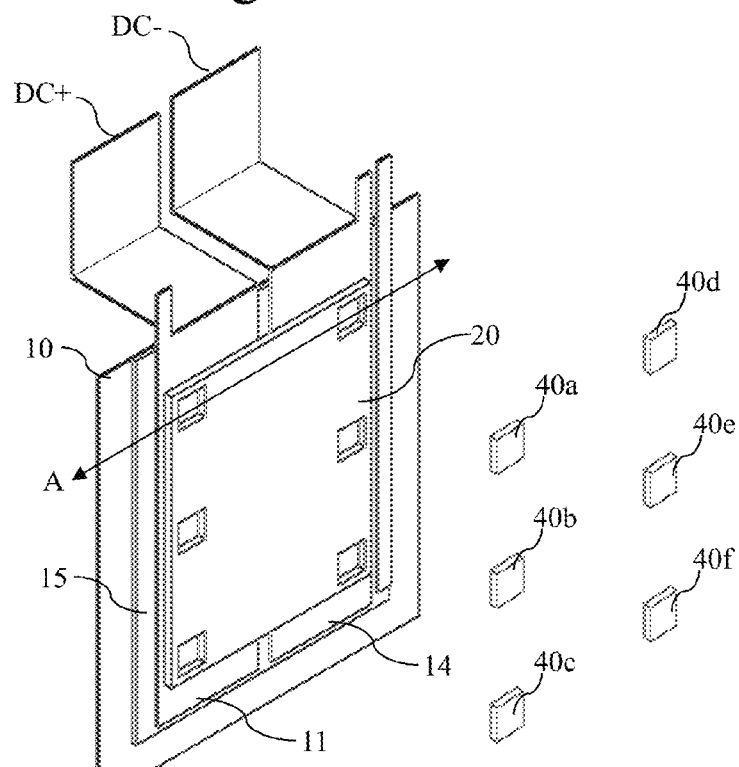
FIG. 4 represents the assembly of FIG. 2 and dies to be placed on the first part of the package of power dies.

FIG. 4 represents the assembly of FIG. 2 and dies to be placed on the first part of the package of power dies.

The dies 40a to 40f are intended to be placed respectively in the holes 20a to 20f.

Figure 5:
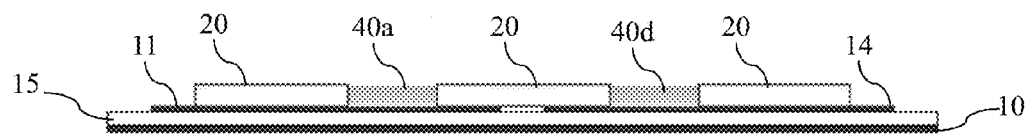
FIG. 5 represents a section along the plane A of FIG. 4.

FIG. 5 represents a section along the plane A of FIG. 4.

The die 40a is in electric contact with the metal plate 11 and the die 40d is in electric contact with the metal plate 14. The insulation substrate 15 avoids an electric contact between the metal plates 11 and 14 with the metal plate 10.

Figure 6:
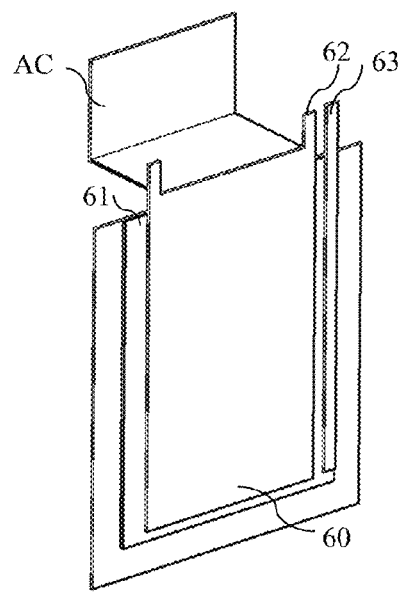
FIG. 6 represents a second part of the package of power dies.

FIG. 6 represents a second part of the package of power dies.

The second part of a package of power dies is composed of a metallic plate 60 on which an electric insulation substrate 61 is placed. A metallic plate 60 is put on the electric insulation layer 61, for example a ceramic layer. The metallic plates are for example copper plates.

The metallic plate 60 comprises a first connection part 62 and a second connection part AC which is folded.

The second connection part AC is used for connecting the package of power dies to a an alternative voltage terminal and the first connection part 62 is used for providing a connection to drivers not shown in FIG. 6 to the alternative voltage terminal.

A second metallic plate 63 is placed on the electric insulation plate 61. The second metallic plate 63 purpose is to provide an electric connection of gates of dies to drivers. The metallic plate 63 is formed to provide contact with the individual gates of dies, but is not shown on FIG. 6 for simplicity.

Figure 7:
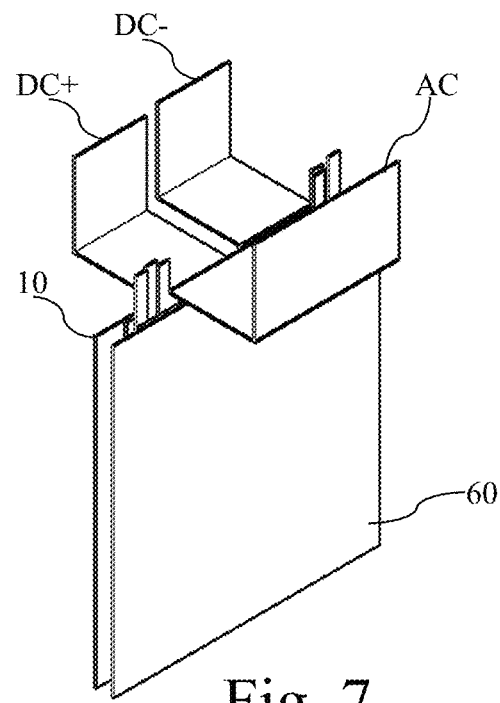
FIG. 7 represents the first and second parts of the package of power dies prior to be pressed.

FIG. 7 represents the first and second parts of the package of power dies prior to be pressed.

The metal plates 10 and 60 are placed front to front, dies 40a to 40f are in the middle of the sandwich made by the plates 10 and 60.

Figure 8:
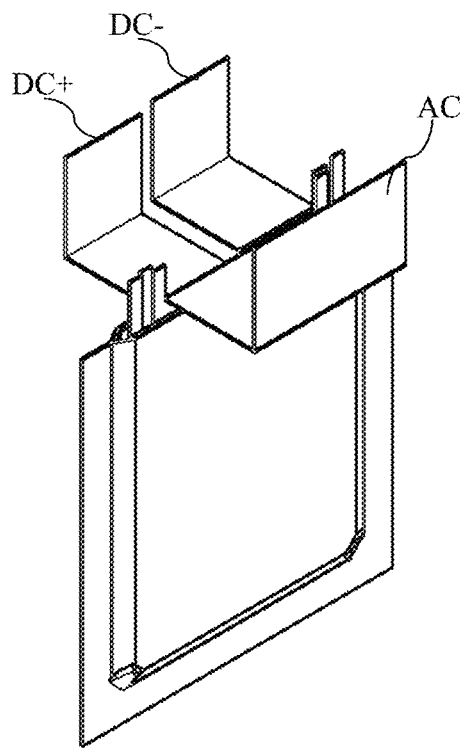
FIG. 8 represents the first and second parts of the package of power dies after being pressed and mechanically joined.

FIG. 8 represents the first and second parts of the package of power dies after being pressed and mechanically joined.

The bottom, left and right sides of the metal plates 10 and 60 are pressed together assuring an electric contact of the dies 40a to 40f with the metal plate 66.

Figure 9:
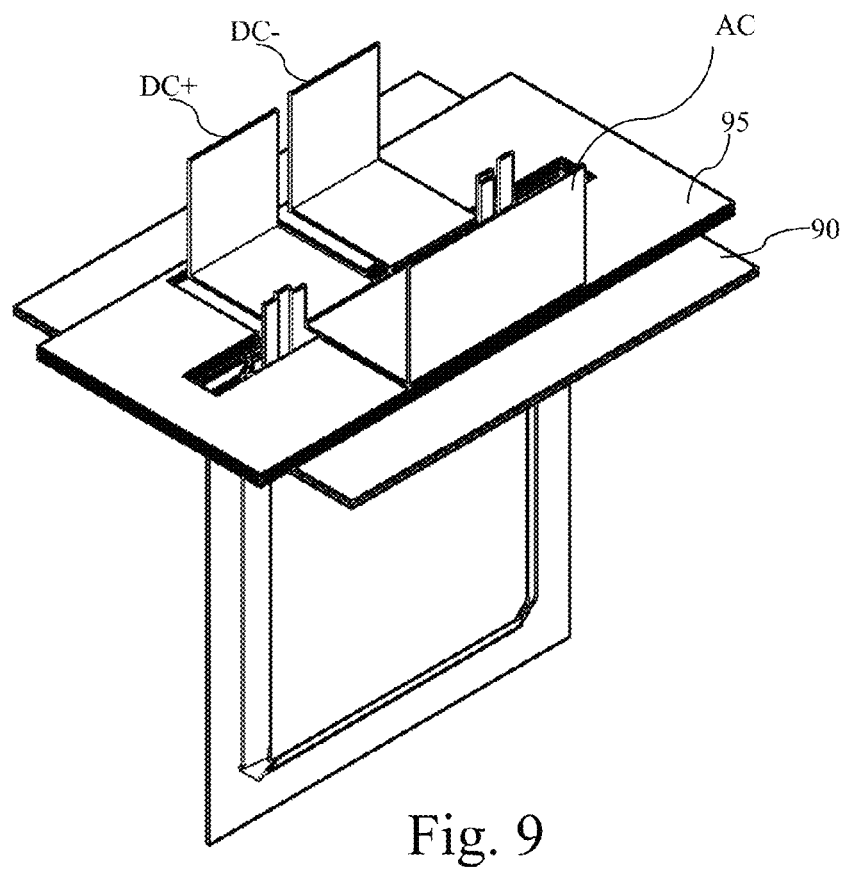
FIG. 9 represents the package of power dies on which an interconnecting component with its support are placed.

FIG. 9 represents the package of power dies on which an interconnecting component with its support are placed.

An interconnection component 95 is placed on a mechanical support 90. The mechanical support is for example a metallic support.

The interconnection component is composed of three copper layers insulated from each other. One layer is for the DC+ connection, one for the DC− connection and one is for the AC connection.

Figure 10:
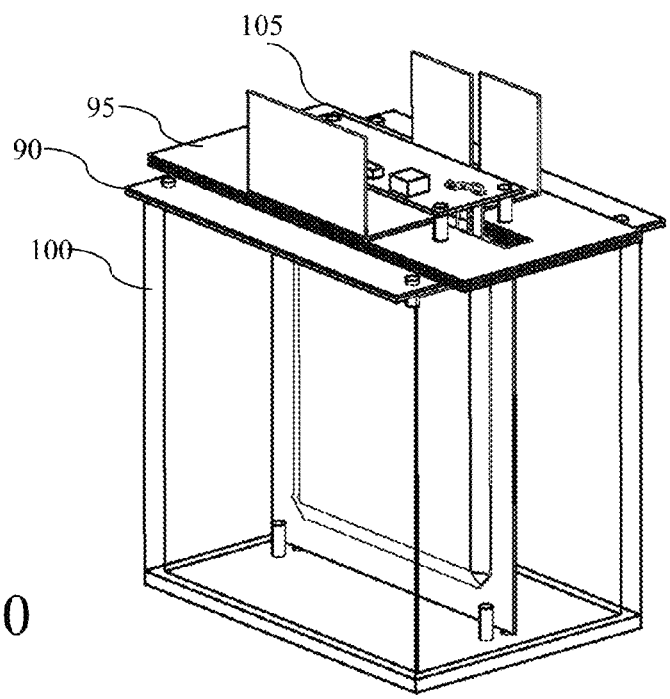
FIG. 10 represents the assembly of the package of power dies in a reservoir containing heat transfer medium.

FIG. 10 represents the assembly of the package of power dies in a reservoir containing heat transfer medium.

The heat transfer medium is for example electrically isolation liquid or gas.

The package of power dies is placed in a metallic reservoir 100 filled with electrically isolation liquid.

Gate drivers 105 are placed on the interconnection component 95 and the support 90 is fixed on the reservoir 100.

The connections 12, 13, 16, 62 and 63 are linked to the Gate drivers 105.

Figure 11:
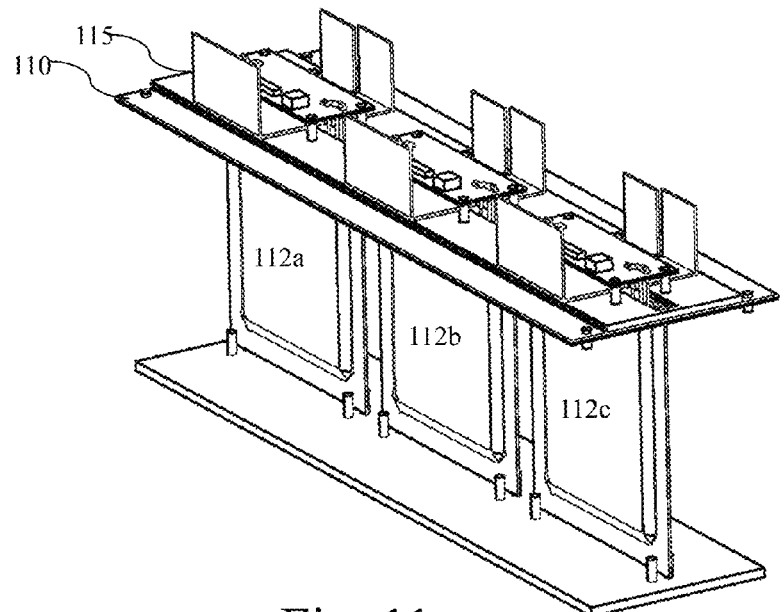
FIG. 11 represents plural packages of power dies on which an interconnecting component with its support are placed.

FIG. 11 represents plural packages of power dies on which an interconnecting component with its support are placed.

Figure 12:
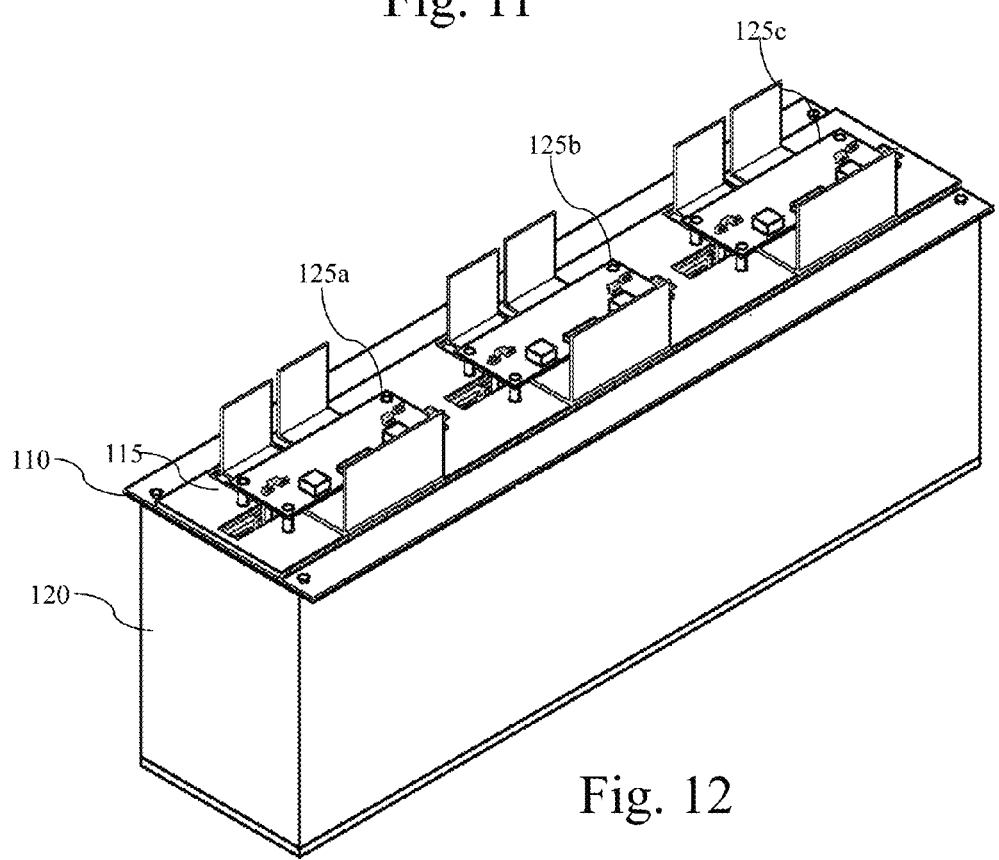
FIG. 12 represents the assembly of the packages of power dies in a reservoir containing heat transfer medium.

FIG. 12 represents the assembly of the packages of power dies in a reservoir containing heat transfer medium.

The heat transfer medium is for example electrically isolation liquid or gas.

An interconnection component 115 is placed on a mechanical support 110. The mechanical support is for example a metallic support.

The interconnection component 115 is composed of three copper layers insulated from each other. One layer is for the DC+ connection for each package of power dies 112a to 112c, one for the DC− connection for each package of power dies 112a to 112c and one is for the AC connection for each package of power dies 112a to 112c.

Figure 13:
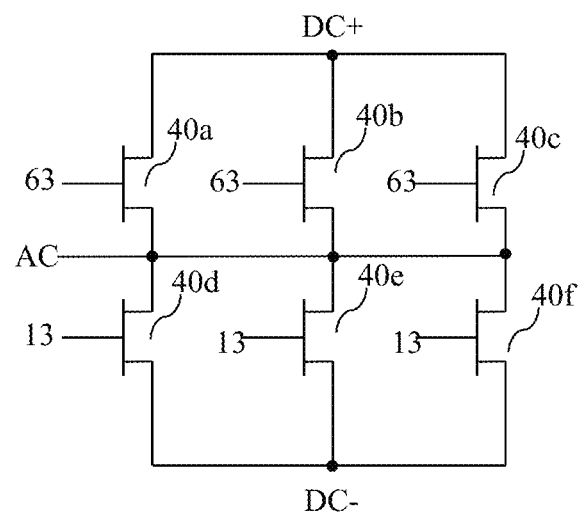
FIG. 13 represents the electric interconnections of the dies.

FIG. 13 represents the electric interconnections of the dies.

The package of power dies are placed in a metallic reservoir 120 filled with electrically isolation liquid.

Gate drivers 125a to 125c are placed on the interconnection component 115 and the support 110 is fixed on the reservoir 120.

Naturally, many modifications can be made to the embodiments of the invention described above without departing from the scope of the present invention.

The invention claimed is:

1. A package of power dies characterized in that the package of power dies is composed of a first part and a second part, the first part is composed of a plaque composed of cavities on which dies are placed, the plaque is placed on a first, a second, and a third metallic plates placed on an electric insulation substrate, the electric insulation layer is placed on a fourth metallic plate, the second part being composed of a fifth and a sixth metallic plates placed on another electric insulation substrate, the other electric insulation layer being placed on a seventh metallic plate, the fourth and the seventh metallic plates are mechanically joined, the dies are divided into two groups of dies, a first group of dies having an electric contact with the first, fifth and sixth metallic plates and a second group of dies being in contact with the second, third and sixth metallic plates and wherein the first plate is a positive DC voltage connection, the second plate is a negative DC voltage connection, the third plate is a gate connection of the dies of the second group of dies, the fourth plate is an AC voltage connection and the fifth plate is a gate connection of the gates of the first group of dies.

2. The package of dies according to claim 1, characterised in that the first, second and fifth metallic plates extend outside the fourth and the seventh metallic plates mechanically joined and are folded outside the fourth and the seventh metallic plates mechanically joined.

3. The package according to claim 2, characterised in that the folded parts lie on an interconnection component placed on a mechanical support.

4. The package according to claim 3, characterized in that the mechanical support is a cover of a reservoir comprising heat transfer medium and the fourth and the seventh metallic plates mechanically joined are emerged in the heat transfer medium.

5. The package according to claim 4, characterised in that the first, second, third, fifth and sixth metallic plates extend outside the fourth and the seventh metallic plates mechanically joined and are connected to gate drivers of the dies.

6. A three-phase power converter comprising three packages according to claim 1.

* * * * *